(12) United States Patent
Kim et al.

(10) Patent No.: US 6,987,418 B2
(45) Date of Patent: Jan. 17, 2006

(54) SOUND SIGNAL GENERATING APPARATUS AND METHOD FOR REDUCING POP NOISE

(75) Inventors: Il Joong Kim, Youngin (KR); Goog Chun Cho, Gunpo (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 88 days.

(21) Appl. No.: 10/672,839

(22) Filed: Sep. 26, 2003

(65) Prior Publication Data

US 2004/0217808 A1 Nov. 4, 2004

(30) Foreign Application Priority Data

May 2, 2003 (KR) ................................ 10-2003-0028174

(51) Int. Cl.
*H03F 3/38* (2006.01)

(52) U.S. Cl. ..................................... 330/10; 330/207 A
(58) Field of Classification Search .................. 330/10, 330/207 A, 251, 146

See application file for complete search history.

(56) References Cited

U.S. PATENT DOCUMENTS

| | | | |
|---|---|---|---|
| 6,118,336 A | | 9/2000 | Pullen et al. |
| 6,509,793 B2 * | | 1/2003 | Kim .......................... 330/10 |
| 6,636,113 B1 * | | 10/2003 | Kirn .......................... 330/10 |
| 6,744,311 B2 * | | 6/2004 | Kirn .......................... 330/10 |
| 6,809,586 B1 * | | 10/2004 | Hobboosh et al. ............ 330/10 |

FOREIGN PATENT DOCUMENTS

| | | |
|---|---|---|
| EP | 0503571 | 9/1992 |
| EP | 1184973 | 3/2002 |

* cited by examiner

*Primary Examiner*—Henry Choe
(74) *Attorney, Agent, or Firm*—F. Chau & Associates, LLC

(57) ABSTRACT

A circuit for handling pulse width modulation (PWM) first signal and PWM second signal for outputting to an amplifier, the PWM first signal having one of a same phase and an opposite phase relationship with the PWM second signal, the circuit comprising a power detector for detecting power turn on to the amplifier and outputting a power on signal and detecting a power turn off to the amplifier and outputting a power off signal; a pulse generator having: a duty cycle generator for generating a first pulse signal corresponding to the PWM first signal and a second pulse signal corresponding to the PWM second signal, and a reduced-width generator for generating at least one of a reduced-width first pulse and a reduced-width second pulse; a controller for selecting one of the reduced-width first pulse and the reduced-width second pulse for outputting to the amplifier upon receipt of the power on signal and for selecting the first pulse signal and the second pulse signal for outputting to the amplifier thereafter; and a counter for counting the duration of the pulse width of the PWM first signal, the counter being activated upon detection of the power off signal and a select circuit for outputting an off select signal upon reaching a predetermined reduced-width time count to cause an output of one of a reduced-width PWM first signal and a reduced-width PWM second signal.

33 Claims, 13 Drawing Sheets

SOUND SIGNAL GENERATING APPARATUS AND METHOD FOR REDUCING POP NOISE

BACKGROUND OF THE INVENTION

1. Field of the Invention

The present invention is directed to a sound signal generating apparatus and method for reducing pop noise in a class-D amplifier.

2. Discussion of the Related Art

Audio signal amplifiers used for amplifying audio signals are generally classified into classes A, AB, B, C, and D depending on their operating state during power amplifying stage.

Among the various classes of audio signal amplifiers, the class-D amplifiers are more popular because their efficiency is higher than that of class AB amplifiers and their linearity is also superior due to low cross-over.

Class-D amplifiers are also referred to as switch-mode amplifiers because they resemble switch-mode voltage regulators. A class-D amplifier uses Pulse Width Modulation (PWM) method on an input analog signal or digital PCM signal. This means an input analog signal is modulated by a higher frequency modulation or carrier signal, usually a saw-tooth triangular wave or an input digital PCM signal is converted to a related PWM signal. Upon pulse width modulation, the analog input signal or digital PCM signal becomes discreet or digital with pulse widths used to represent signal strengths of the input original.

The PWM signal presented to the amplifier is a high frequency digital signal with varying widths. A low band pass filter is used to filter the high frequency component to extract the input signal and reduce switching noise.

FIG. 1 shows a waveform of input signals PWMA and PWMB being applied to a conventional class-D amplifier, wherein pulse width modulating signals PWMA, PWMB have substantially the same pulse width but are opposite to each other in phase. FIG. 2 shows a waveform of a speaker voltage VC1 when PWMA, PWMB and power DET1 are applied (Here, DET1 is transited from "Low" to "High" when voltage is turned on). It can be seen from FIG. 2 that a severe overshoot occurs at or near the time when power is applied. The overshoot is caused by the same pulse width of the pulse width modulating signals PWMA, PWMB. This overshoot voltage VC1 at the speaker results in 'click or pop' noise.

Therefore, a need exists for an apparatus and a method for generating PWM signals which operate a class-D amplifier but without the pop noise upon application of power or when power is removed from the amplifier.

SUMMARY OF THE INVENTION

A circuit is provided for handling pulse width modulation (PWM) first signal and PWM second signal for outputting to an amplifier, the PWM first signal having one of a same phase and an opposite phase relationship with the PWM second signal, the circuit comprising: a power detector for detecting power turn on to the amplifier and outputting a power on signal; and a pulse generator having: a duty cycle generator for generating a first pulse signal corresponding to the PWM first signal and a second pulse signal corresponding to the PWM second signal; and a pulse reducing generator for generating a reduced-width first pulse or a reduced-width second pulse for outputting to the amplifier upon receipt of the power on signal.

Preferably, the pulse generator further includes a controller for outputting the reduced-width first pulse or the reduced-width second pulse upon receipt of the power on signal and for outputting the first pulse signal and the second pulse signal to the amplifier thereafter.

According to this embodiment, the circuit further preferably includes a select circuit for generating a select signal for selecting between the PWM first and second signals during one selection mode and the signals from the pulse generator during another selection mode, and a counter for counting time upon receipt of the power on signal and to output the select signal in the another selection mode upon reaching a predetermined count for outputting the PWM first and second signals to the amplifier, wherein the reduced-width first pulse is about one-half the pulse width of the first pulse signal.

According to an aspect of the invention, the circuit further includes a delay for delaying by a predetermined time the first pulse signal to output a delayed first pulse signal that transitions with a delay by the predetermined time to provide a time gap between the transition of the delayed first pulse signal and the transition of the second pulse signal, wherein the amplifier includes a serially connected pair of transistors for receiving at their gates the first pulse signal and the second pulse signal.

According to another embodiment of the present invention, a circuit is provided for handling pulse width modulation (PWM) first signal and PWM second signal for outputting to an amplifier, the PWM first signal having one of a same and an opposite phase relationship with the PWM second signal, the circuit comprising: a power detector for detecting power turn off to the amplifier and outputting a power off signal; and a counter for counting the duration of the pulse width of the PWM first signal, the counter being activated upon detection of the power off signal, and for outputting a select signal upon reaching a predetermined reduced-width time count to cause an output of a reduced pulse width PWM first signal or reduced pulse width PWM second signal prior to complete power turn off from the amplifier. Preferably, the circuit further includes a synchronizing circuit for synchronizing the power off signal using a system clock, wherein the amplifier includes a pair of transistors for receiving at their gates the PWM first signal and the PWM second signal.

The circuit further includes a mute circuit for outputting the select signal to cause an output of a reduced pulse width PWM first signal or reduced pulse width PWM second signal upon receipt of a mute signal, wherein the mute circuit is an AND gate, and wherein the reduced pulse width PWM first signal or reduced pulse width PWM second signal is the last pulse signal received by the amplifier prior to complete power turn off, and wherein the reduced-width is about one half of the width of the PWM first signal or the PWM second signal.

According to still another embodiment of the invention, a circuit is provided for handling pulse width modulation (PWM) first signal and PWM second signal for outputting to an amplifier, the PWM first signal having one of a same phase and an opposite phase relationship with the PWM second signal, the circuit comprising: a power detector for detecting power turn on to the amplifier and outputting a power on signal and detecting a power turn off to the amplifier and outputting a power off signal; a pulse generator having: a duty cycle generator for generating a first pulse signal corresponding to the PWM first signal and a second pulse signal corresponding to the PWM second signal, and a reduced-width generator for generating at least one of a reduced-width first pulse and a reduced-width second pulse; a controller for selecting one of the reduced-width first pulse and the reduced-width second pulse for outputting to the amplifier upon receipt of the power on signal and for selecting the first pulse signal and the second pulse signal for outputting to the amplifier thereafter; and a counter for counting the duration of the pulse width of the PWM first signal, the counter being activated upon detection of the power off signal and a select circuit for outputting an off select signal upon reaching a predetermined reduced-width time count to cause an output of one of a reduced-width PWM first signal and a reduced-width PWM second signal, wherein the select circuit further includes a counter for counting time upon receipt of the power on signal and to output an on select signal for first outputting one of the reduced-width first pulse and the reduced-width second pulse and then the first pulse signal and the second pulse signal to the amplifier.

The circuit according to this embodiment further includes a mute circuit for outputting the on select signal for outputting one of the reduced-width first pulse and the reduced-width second pulse to the amplifier upon receipt of a mute signal, wherein the mute circuit is synchronized using a system clock and upon mute inactivation, to cause an output of one of the reduced-width PWM first signal and the reduced-width PWM second signal, wherein the reduced-width first pulse signal has a pulse width about one half of the pulse width of the first pulse signal, and wherein the predetermined reduced-width time count is about one half the duration of the pulse width of the PWM first signal.

The circuit according to this embodiment further includes a delay for delaying by a predetermined time the first pulse signal to output a delayed first pulse signal that transitions with a delay by the predetermined time to provide a time gap between the transition of the delayed first pulse signal and the transition of the second pulse signal, wherein the amplifier includes a pair of transistors for receiving at their gates the delayed first pulse signal and the second pulse signal, wherein the amplifier includes a pair of transistors for receiving at their gates the first pulse signal and the second pulse signal.

According to another aspect of the invention, a method is provided for handling pulse width modulation (PWM) first signal and PWM second signal for outputting to an amplifier, the PWM first signal having one of a same phase and an opposite phase relationship with the PWM second signal, the method comprising: detecting power turn on to the amplifier and outputting a power on signal; and generating a first pulse signal corresponding to the PWM first signal and a second pulse signal corresponding to the PWM second signal; and generating a reduced-width first pulse or a reduced-width second pulse for outputting to the amplifier upon receipt of the power on signal.

Preferably, the method further includes outputting the reduced-width first pulse or the reduced-width second pulse to the amplifier upon receipt of the power on signal and outputting the first pulse signal and the second pulse signal to the amplifier thereafter, and generating a select signal for selecting between the PWM first and second signals during one selection mode and the first pulse signal and the second pulse signal during another selection mode for outputting to the amplifier, wherein the reduced-width first pulse is about one-half the pulse width of the first pulse signal.

According to still another aspect of this embodiment, the method further includes delaying by a predetermined time the first pulse signal to output a delayed first pulse signal that transitions with a delay by the predetermined time to provide a time gap between the transition of the delayed first pulse signal and the transition of the second pulse signal, and the steps of: detecting power turn off to the amplifier and outputting a power off signal; counting the duration of the pulse width of the PWM first signal upon detection of the power off signal; and outputting a select signal upon reaching a predetermined reduced-width time count to cause an output of a reduced pulse width PWM first signal or reduced pulse width PWM second signal prior to complete power turn off from the amplifier, wherein the reduced pulse width PWM first signal or reduced pulse width PWM second signal is the last pulse signal received by the amplifier prior to complete power turn off, and wherein the reduced-width is about one half of the width of the PWM first signal or the PWM second signal.

According to still another embodiment of the present invention, a circuit is provided for handling pulse width modulation (PWM) first signal and PWM second signal for outputting to an amplifier, the PWM first signal having one of a same phase and an opposite phase relationship with the PWM second signal, the circuit comprising: means for detecting power turn on to the amplifier and outputting a power on signal and detecting a power turn off to the amplifier and outputting a power off signal; means for generating a first pulse signal corresponding to the PWM first signal and a second pulse signal corresponding to the PWM second signal, and a reduced-width generator for generating at least one of a reduced-width first pulse and a reduced-width second pulse; means for selecting one of the reduced-width first pulse and the reduced-width second pulse for outputting to the amplifier upon receipt of the power on signal and for selecting the first pulse signal and the second pulse signal for outputting to the amplifier thereafter; and a counter for counting the duration of the pulse width of the PWM first signal, the counter being activated upon detection of the power off signal and a select circuit for outputting an off select signal upon reaching a predetermined reduced-width time count to cause an output of one of a reduced-width PWM first signal and a reduced-width PWM second signal.

BRIEF DESCRIPTION OF THE DRAWINGS

The embodiments of the present invention will become more apparent when detailed description of embodiments are read with reference to the accompanying drawings in which.

DETAILED DESCRIPTION OF PREFERRED EMBODIMENTS

Figure 1A:
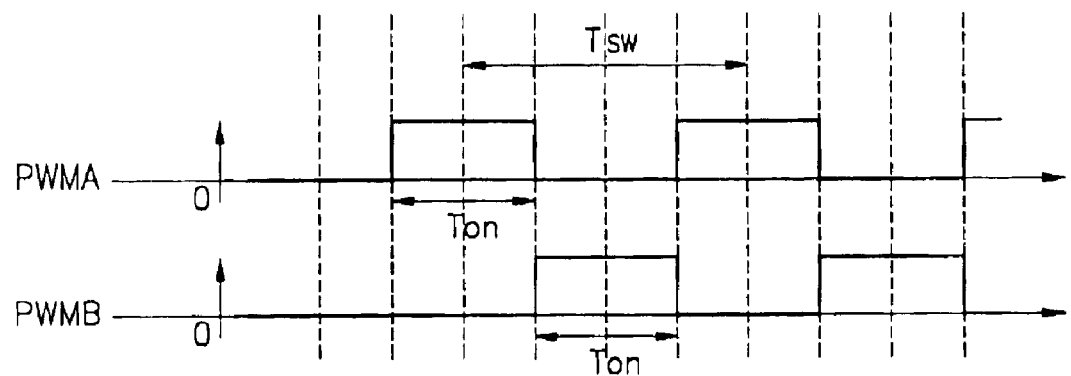
FIG. 1A shows a waveform of a PWM switching signal and FIG. 1B shows a class-D amplifier.

Hereinafter, preferred embodiments of the present invention will be described in detail with reference to the accompanying drawings. It should be noted that like reference numerals are used for designation of like or equivalent parts or portion for simplicity of illustration and explanation.

Figure 3:
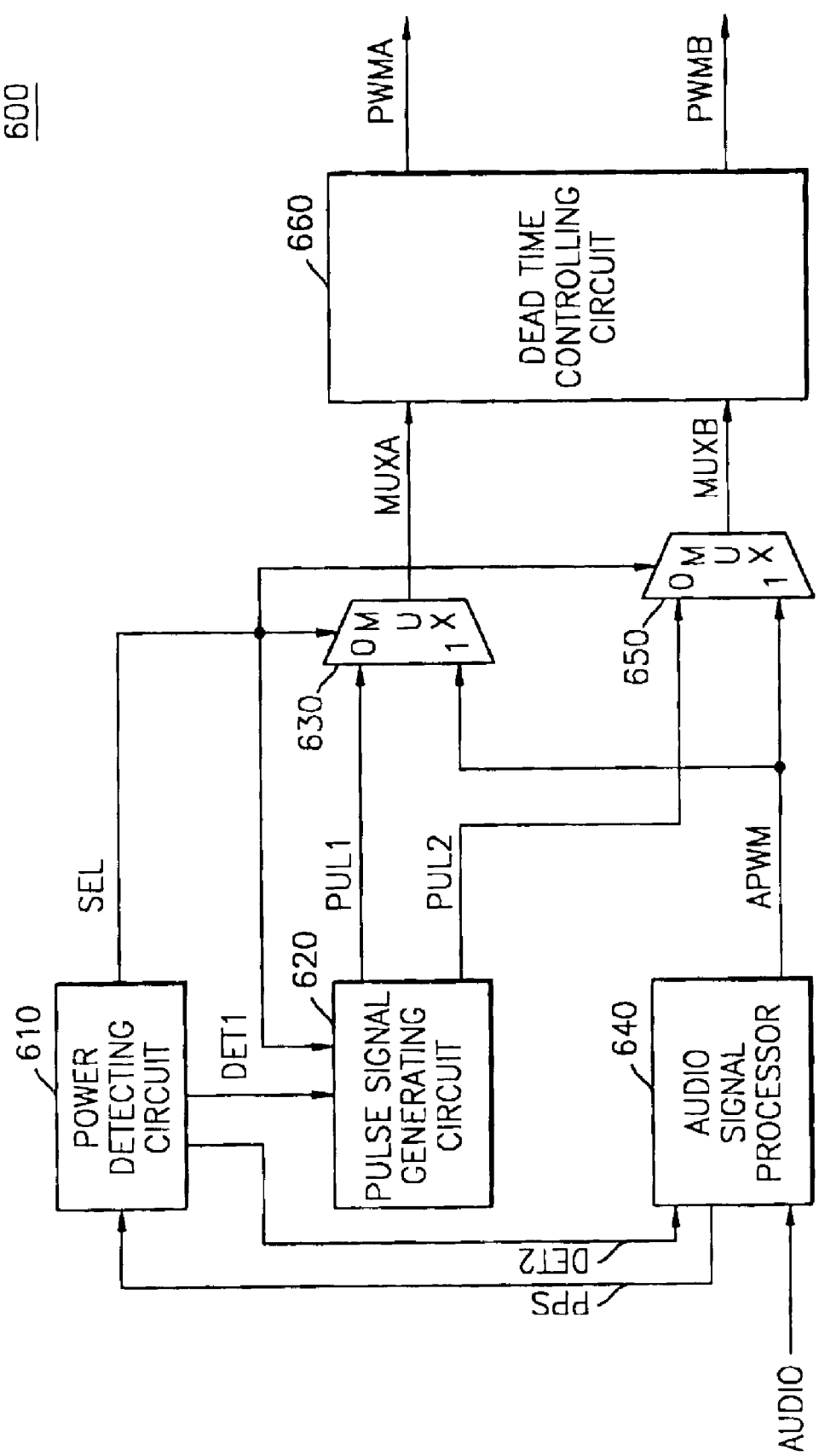
FIG. 3 shows a block diagram of a switching signal generating apparatus according to an embodiment of the present invention.

FIG. 3 is a switching signal generating apparatus 600 according to a preferred embodiment of the present invention.

Referring to FIG. 3, the switching signal generating apparatus 600 includes a power detecting circuit 610, a pulse signal generating circuit 620, a first selection circuit 630, an audio signal processor 640, a second selection circuit 650, and a dead time controlling circuit 660.

The general operation of the switching signal apparatus 600 is herein described. The power detecting circuit 610 detects power turn-on and outputs a first detecting signal DET1 to the pulse signal generating circuit 620. The power detecting circuit 610 also detects a disconnection of the power supply or power off and outputs a second detecting signal DET2, which is output to the audio signal processor 640. The power detecting circuit 610 receives a timing signal PPS for synchronizing timing signals of the device to a system clock. The period of the timing signal PPS corresponds to the period of the PWM signals generated from the audio signal processor 640. Further, the power detecting circuit 610 generates and outputs a control signal SEL to the pulse signal generating circuit 620, the first selection circuit 630, and the second selection circuit 650.

The pulse signal generating circuit 620 generates a first pulse signal PUL1 and a second pulse signal PUL2 in response to the first detecting signal DET1 and control signal SEL. A system clock signal can be used to synchronize the pulse signals PUL1 and PUL2. According to at least one preferred embodiment according to the present invention, the pulse signals PUL1 and PUL2 are shaped by the pulse signal generating circuit 620 to output at opposite phase and to have initial smaller pulse widths upon application of the first detecting signals DET1 to prevent simultaneous turn-on of the transistors on the audio sound regeneration circuit.

The audio signal processor 640 receives an audio input signal AUDIO and modulates the audio input signal AUDIO with a pulse train to output a pulse width modulated audio signal APWM, wherein the width of the pulses represent the strengths of the input audio signal. The audio signal processor 640 outputs the pulse width modulation period PPS and is preferably inactivated when the second detecting signal DET2 is active, signaling power off.

The first selection circuit 630 selects either the first pulse signal PUL1 or the pulse width modulated audio signal APWM in response to the control signal SEL and outputs a first selected signal MUXA. The second selection circuit 650 selects either the second pulse signal PUL2 or the pulse width modulated audio signal APWM in response to the control signal SEL and outputs a second selected signal MUXB. Thus, each output signal from the first and second selection circuits 630, 650 is either the pulse signals PUL1, PUL2 or the pulse width modulated audio signal APWM in opposite phase. The first and second selection circuits 630, 650 are preferably multiplexers.

The dead time controlling circuit 660 receives the first and second selected signals MUXA, MUXB from the first and second selection circuits 630, 650, respectively. According to an embodiment of the present invention, the dead time controlling circuit 660 includes delay elements (not shown) for delaying the switching signals by a predetermined dead time. Preferably, the delay is applied to the rising (transition from low to high) edges of the MUXA and MUXB signals. This dead time delay creates a time gap between the transition of the delayed first pulse signal and the transition of the second pulse signal to prevent simultaneously turning on or off the transistors in an audio sound regenerating apparatus. The dead time controlling circuit 660 outputs first and second switching signals PWMA, PWMB to the audio sound regenerating apparatus.

Figure 4:
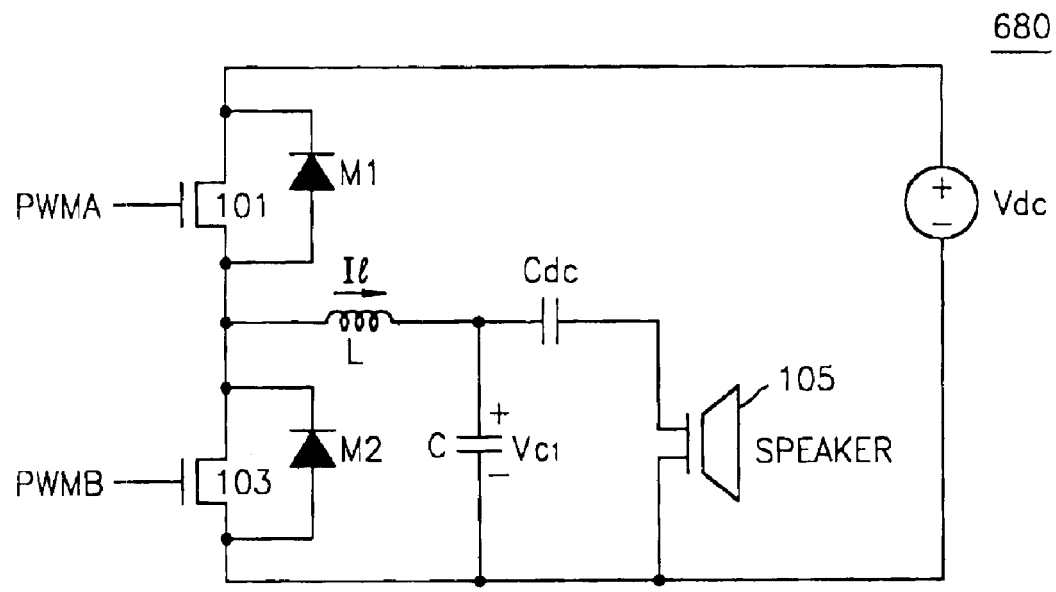
FIG. 4 shows a circuit of a half-bridge typed class-D amplifier having one power source.

FIG. 4 shows a half-bridge type audio sound regenerating apparatus 680, which includes two MOS transistors 101, 103 connected in series, two diodes M1, M2, a band pass filter having an inductance L and a capacitor C, and a speaker 105. One terminal of each of the diode M1 and M2 is connected to a source of the transistor and the other terminal of each of the diode is connected to a drain of the transistor.

The first and second switching signals PWMA, PWMB generated from the switching signal generating circuit 600 are inputted into the gates of the MOS transistors 101, 103, respectively, and are amplified by the MOS transistors 101, 103 corresponding to the first and second switching signals PWMA, PWMB. Since the first and second amplified switching signals PWMA and PWMB include a sound component and a switching frequency component, a low frequency band pass filter is used to filter the switching frequency component to recover the sound signal.

Figure 5A:
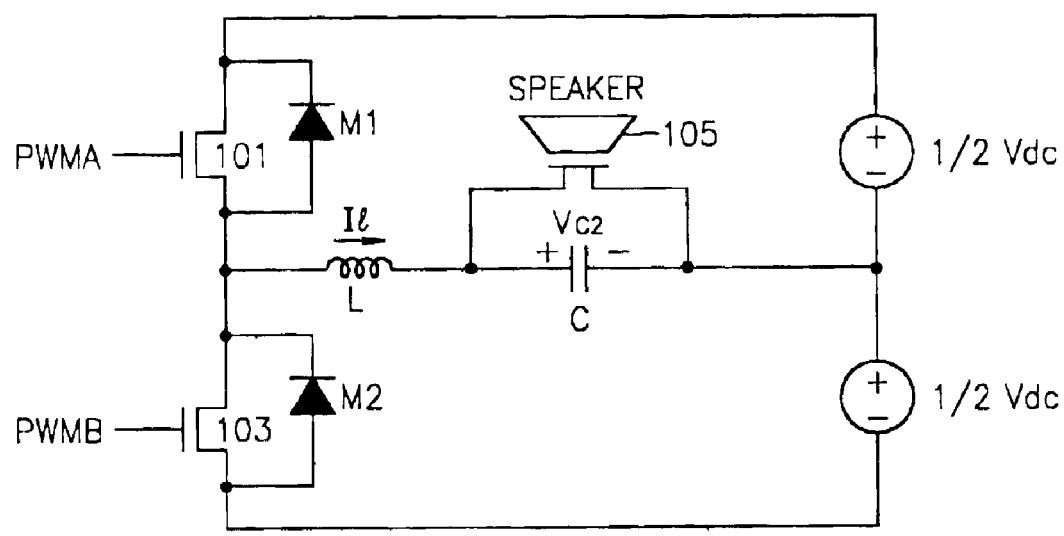
FIG. 5A shows a circuit of a half-bridge typed class-D amplifier having two power sources.
Figure 5B:
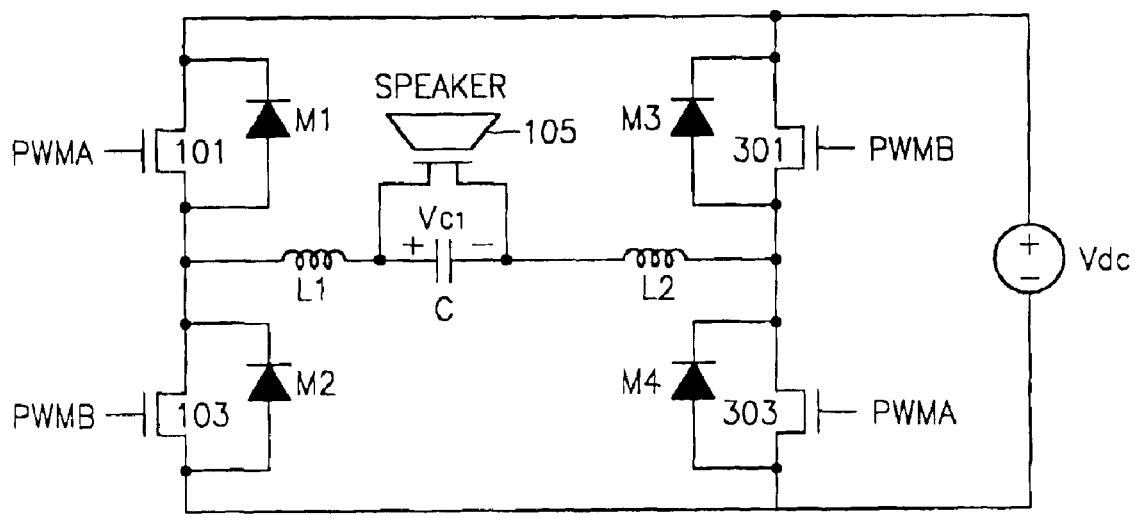
FIG. 5B is a circuit of a full-bridge typed class-D amplifier having one power source.

FIG. 5A shows an alternate audio sound regenerating apparatus, which is a half-bridge type having two transistors 101, 103, two power sources ½Vdc, ½Vdc, a band pass filter having an inductance L and a capacitor C, and a speaker 105. FIG. 5B shows another audio sound regenerating apparatus which is a full-bridge type having one power source Vdc, four transistors 101, 103, 301, 303, and a band pass filter L1, L2, C. One skilled in the art can readily appreciate that the audio sound regenerating apparatus 680 applicable to the present invention is not limited to the apparatus shown in FIGS. 4, 5A and 5B, but includes any audio sound regenerating apparatus having at least two transistors with respective gates for receiving switching signals PWMA, PWMB, and a low band pass filter.

Figure 6:
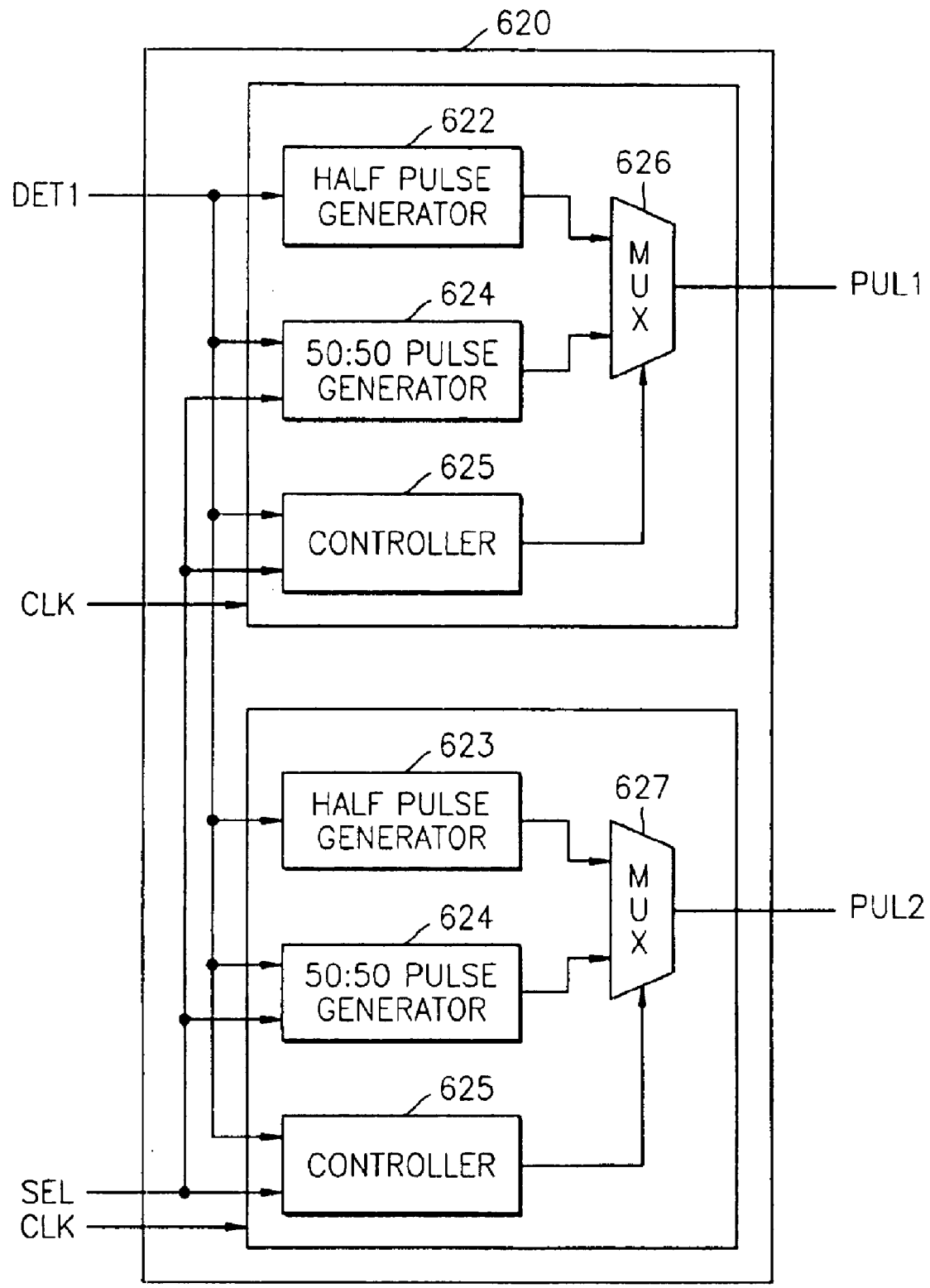
FIG. 6 shows a detail block diagram of a pulse signal generating circuit of FIG. 3.

FIG. 6 is an exemplary circuit diagram of the pulse signal generating circuit 620 of FIG. 3. This circuit receives as inputs the power-on detect signal DET1 and signal SEL from power detect circuit 610 to generate pulse signals PUL1 and PUL2. Upon transition from 'Low' to 'High' of the DET1 signal, the half-pulse generators 622 and 623 generate initial pulses at half width (quarter cycle) to output through MUX 626 and MUX 627 the initial pulses of PUL1 and PUL2 with a pulse width equal to one half (½) of the pulse width of modulated audio signal APWM. Then, MUX 626 and MUX 627 are selected to pass through signals output from the 50:50 pulse generators 624 in response to control signals from controllers 625, with duty cycle the same as system clock CLK and same period as pulse period signal PPS. According to an alternative embodiment, only one of the two half-pulse generators 622 and 623 is employed, depending on whether transistors 101, 301, 103, 301 are NMOS or PMOS type, to generate an initial half pulse at either PUL1 or PUL2.

Figure 1B:
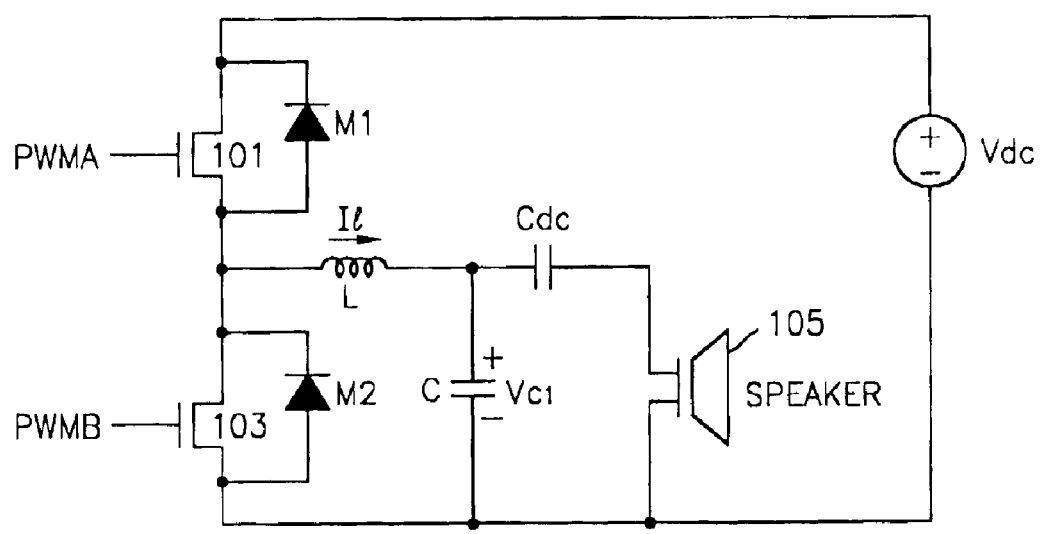
Figure 7:
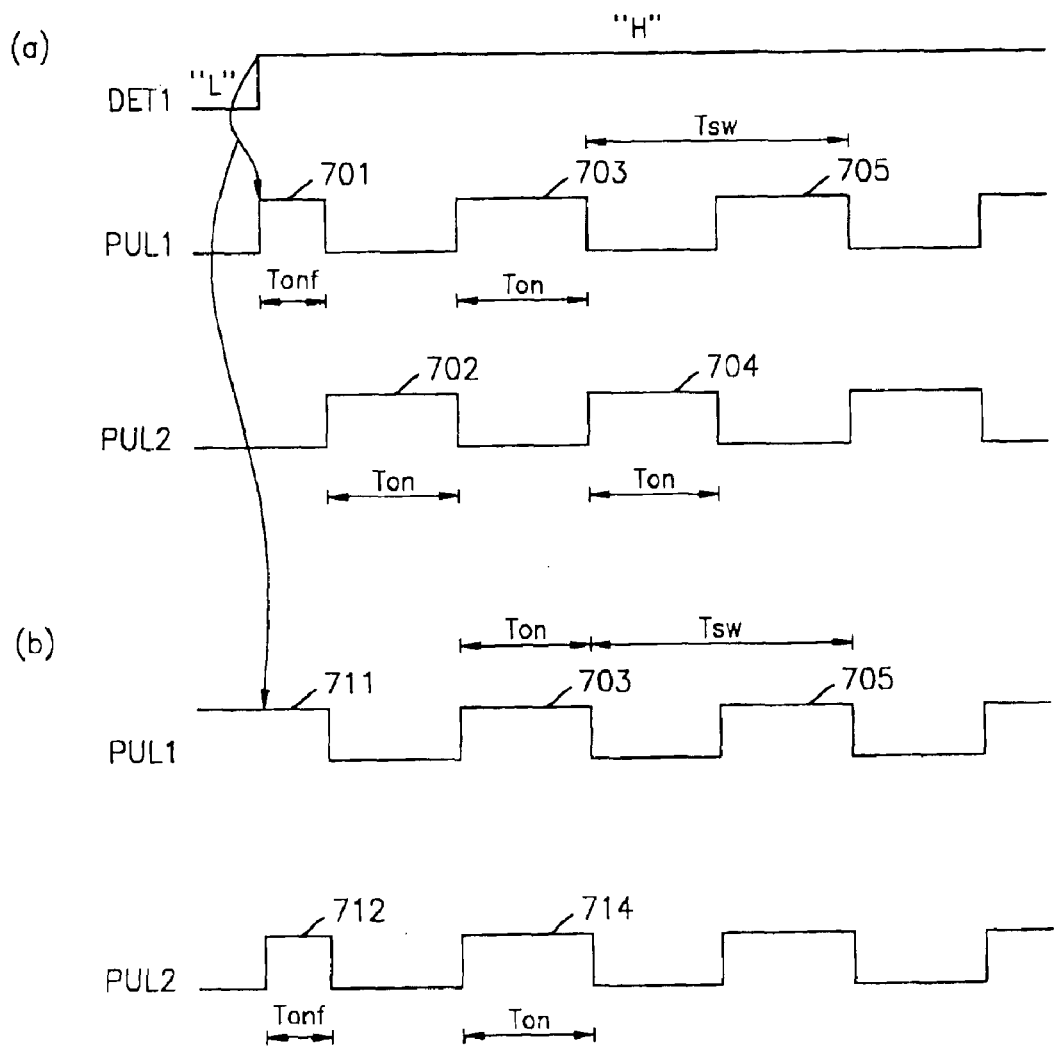
FIG. 7 shows waveforms of a first detecting signal DET1 and first and second pulse signals PUL1, PUL2 from the pulse signal generating circuit according to an embodiment of the present invention.

FIG. 7(a) shows waveforms of the first detecting signal DET1 and the first and second pulse signals PUL1, PUL2 in case that the MOS transistors 101, 303, 103, 301 of FIGS. 1 and 3 are NMOS transistors. It can be seen that signals PUL1 and PUL2 are opposite in phase at all times. FIG. 7(b) shows waveforms of the first and second pulse signals PUL1, PUL2 applicable when the MOS transistors 101, 303 of FIGS. 1 and 3 are PMOS transistors and the MOS transistor 103, 301 are NMOS transistors. It can be seen that signals PUL1 and PUL2 are in phase at all times.

Figure 8:
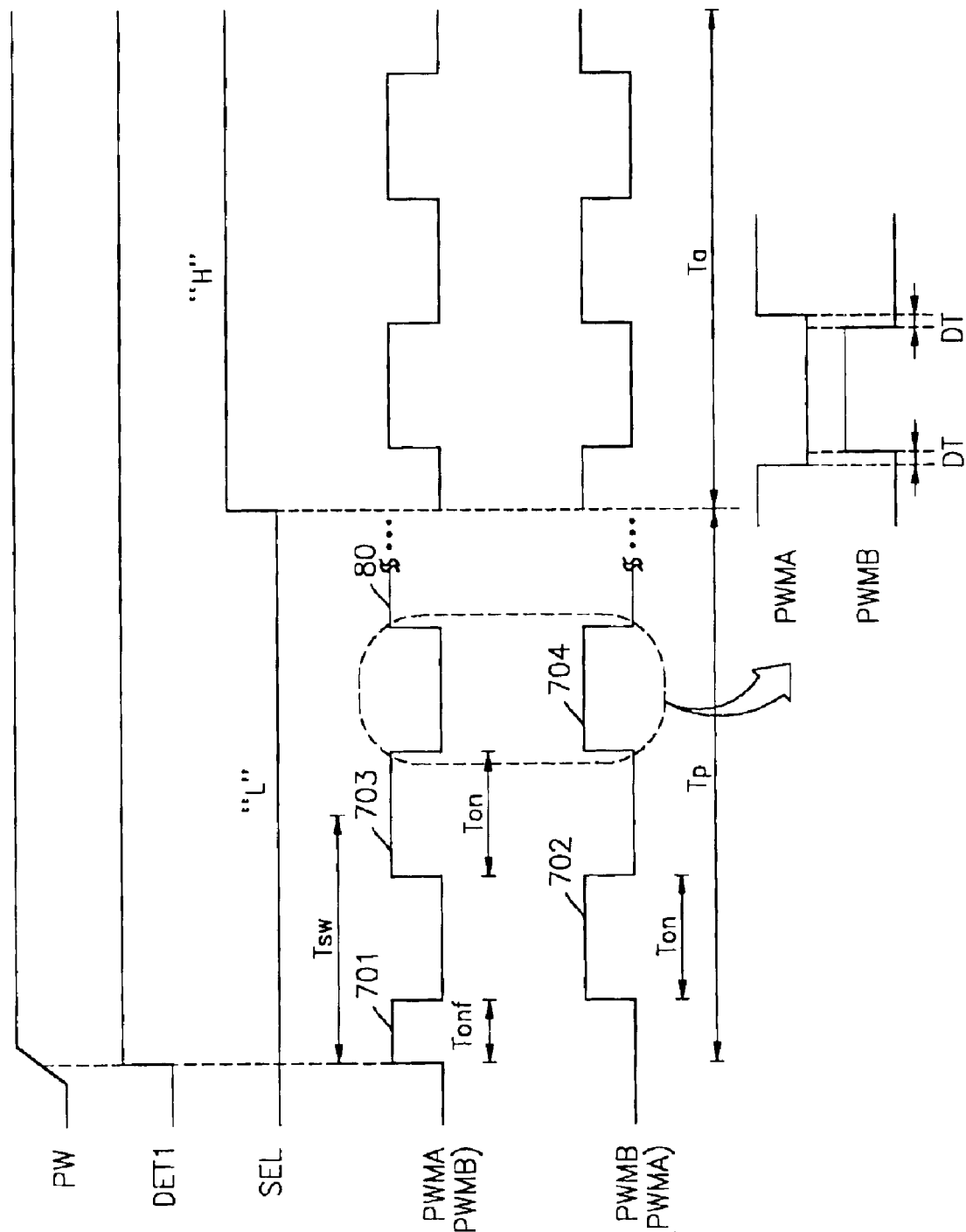
FIG. 8 shows switching waveforms at a time of power-on for the switching signal generating apparatus.

FIG. 8 shows switching waveforms at a time of power-on for the switching signal generating apparatus 600 and switching signals PWMA, PWMB. With select signal SEL initially at logic level 'Low', signals PUL1 and PUL2 are output through first select circuit 630 and second select circuit 650 as PWMA and PWMB.

Operation of the switching signal generating apparatus 600 is further described with reference to FIGS. 3, 6, 7, and 8. When power PW is supplied to the switching signal generating apparatus 600, the power detecting circuit 610 outputs the first detecting signal DET1 with transition from logic level 'Low' to logic level 'High' to the pulse signal generating circuit 620. The power detecting circuit 610 also outputs signal SEL, initially having logic level 'Low', to the pulse signal generating circuit 620, the first selection circuit 630, and the second selection circuit 650.

The pulse signal generating circuit 620 generates the first pulse signal PUL1 and the second pulse signal PUL2 in response to the first detecting signal DET1, as shown in FIGS. 7(a) and 7(b). The audio signal processor 640 outputs the pulse width modulated audio signal APWM.

The first selection circuit 630 outputs the first selected signal MUXA to the dead time controlling circuit 660 and the second selected signal MUXB to the dead time controlling circuit 660 in response to the 'Low' level of the control signal SEL.

The dead time controlling circuit 660 outputs the first and second switching signals PWMA, PWMB to the MOS transistors of the audio sound regenerating apparatus 680 (FIGS. 4, SA and 5B).

It can be seen from FIGS. 7(a) and 8 that a width Tonf of a first pulse 701 of the first pulse signal PUL1 is about Ton/2, and is smaller than each width (Ton) of other pulses 702, 703, 704, 705. The first pulse 701 represents a first generated pulse of the first pulse signal PUL1 at the pulse signal generating circuit 620 when the power PW is supplied. The pulses 703, 705 represent second and third pulses, respectively, of the first pulse signal PUL1. The pulse 702 represents a first pulse of the second pulse signal PUL2, and the pulse 704 represents a second pulse of the second pulse signal PUL2. Preferably, the pulse width Tonf of the first pulse 701 of the first pulse signal PUL1 is about one half the width of the other pulses 702, 703, 704, 705. Further, the width Tonf of the first pulse 701 of the first pulse signal PUL1 is about a quarter (¼) cycle of the other pulses 702, 703, 704. Each cycle (Tsw) of the other pulses 702, 703, 704, 705 is the same as a cycle of the pulse width modulated audio signal APWM. A width of an (n)-th pulse is substantially the same as a width of an (n+1)-th pulse. The initial pulse width 701 applied to the transistor of a class-D amplifier (e.g., 101 in FIG. 4) acts to turn on the transistor at reduced energy upon application of power, thus the pop-noise is minimized since an excess response is minimized. Although the initial pulse width of PUL1 or PUL2 is reduced to one half pulse width as described, other pulse width reductions, such as one quarter to one third pulse width can also be applicable to reduce pop noise.

After a predetermined time is passed, the control signal SEL is changed from logic 'Low' to logic 'High', and the pulse signal generating circuit 620 is disabled in response to the active (logic 'High') control signal SEL. Then, the output of the audio signal processor 640, the pulse width modulated audio signal APWM, is selected by the first and second selector circuits 630 and 650 to the dead time control circuit 660. According to an embodiment of the present invention, the predetermined time is set by a manufacturer as a default value or by a user as any value. According to the embodiment as shown in FIG. 8, the predetermined time is about 2½ cycles.

The dead time control circuit 660 outputs the first and second switching signals PWMA, PWMB to the MOS transistors of the class-D amplifiers 408 (FIGS. 4 and 5). According to an embodiment of the present invention, the predetermined dead time (DT) is a time for protecting simultaneously turning-on or off of the MOS transistors 101, 103, 301, 303. The dead time control circuit 660 makes smaller the width of at least one the first and second switching signals PWMA, PWMB by the predetermined dead time (DT), thus preventing simultaneously turning-on or off the MOS transistors 101, 103, 301, 303. The dead time controlling circuit 660 includes delay elements for implementing the delay (dead time) to make smaller one or both switching signals PWMA and PWMB shorter in pulse width at logic 'High'. According to one embodiment, the delay is applied to the rising edges of both switching signals PWMA and PWMB.

Referring again to FIG. 8, the switching signal generating apparatus 600 outputs the first and second switching signals PWMA, PWMB during the predetermined period "Tp" (or "Starting Mode"). During the "Tp" period, the first and second switching signals PWMA, PWMB are substantially the same as the first and second pulse signals PUL1, PUL2. After "Tp" period, the switching signal generating apparatus 600 outputs the first and second switching signals PWMA, PWMB during a "Ta" period (or "Sound PWM Mode"). During the "Ta" period, the first and second switching signals PWMA, PWMB are substantially the same as the pulse width modulated audio signal APWM. According to an embodiment of the present invention, the pulse widths 702, 704 of the second switching signal PWMB are smaller than the signal PWMA, preferably at an amount of 2*DT, as compared to switching signal PWMA, pulses 703 and 705.

Figure 9:
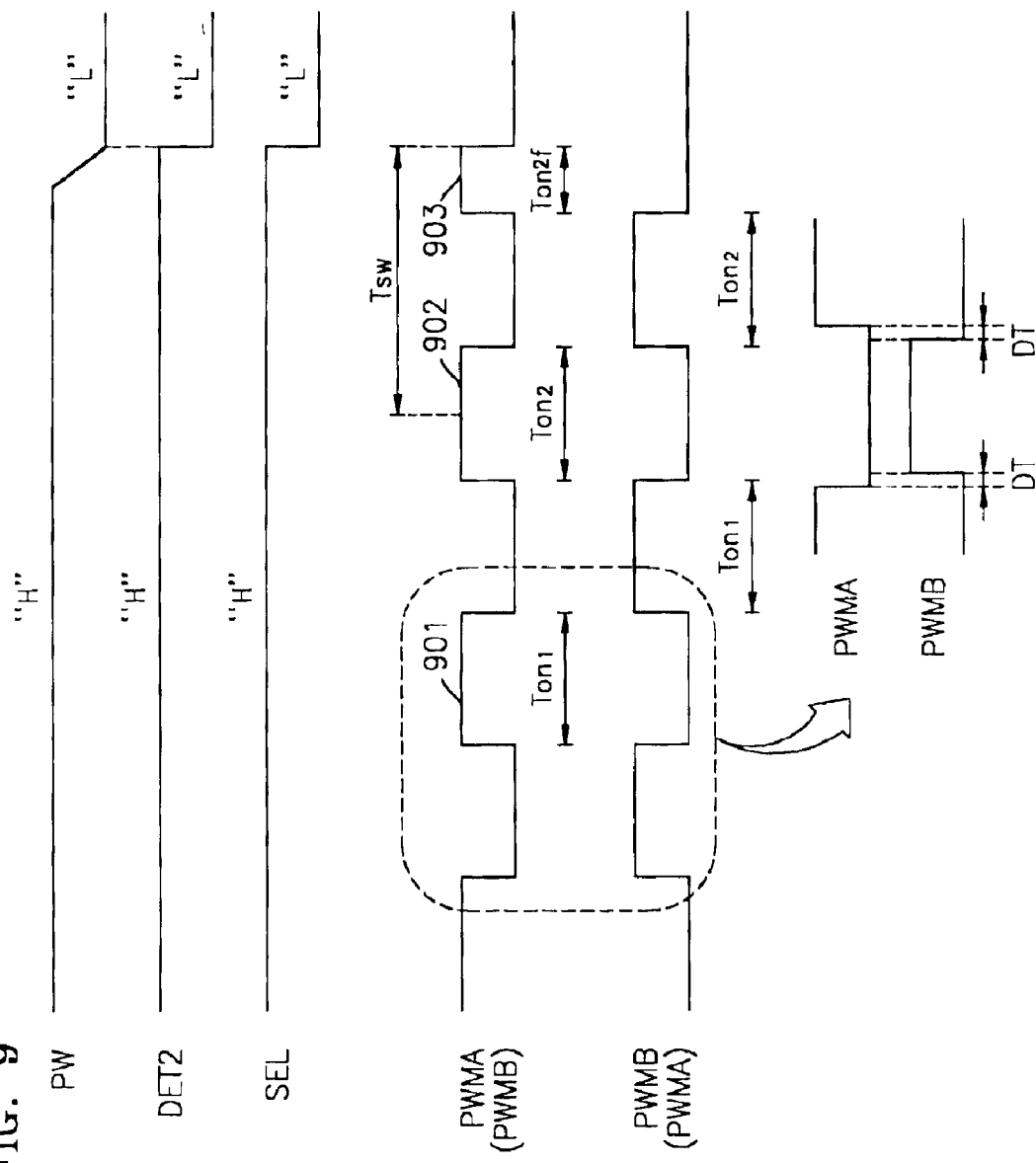
FIG. 9 shows switching waveforms at a time of power-off for the switching signal generating apparatus.

Protective measures applicable to power-off from the amplifier is described with reference to FIG. 9, which shows switching waveforms at a time of power-off for the switching signal generating apparatus 600.

According to a preferred embodiment of the invention, the audio signal processor 640 estimates on-periods Ton1, Ton2 of signal APWM and outputs an estimated value PPS to the power detecting circuit 610. Preferably, the pulse period or duration of each cycle of the first and second switching signals PWMA, PWMB are substantially constant, and the on-periods Ton1, Ton2 are variable according to an audio signal AUDIO. The cycle duration is preferably estimated by using a counter (not shown). This counter value can be stored in a buffer unit (not shown) and the buffer is updated with the estimated value PPS every cycle. The estimated value PPS is used for controlling a pulse width 903 to reduce pop-noise when the supplied power PW is turning off, that is, the power PW transitions from level 'High' to level 'Low'.

During power-off, the power detecting circuit 610, the pulse signal generating circuit 620, and the audio signal processor 640 can be disabled. The power detecting circuit 610 detects the power-off and outputs a second detecting signal DET2 to the audio signal processor 640. The audio signal processor 640 stops the operation of pulse width modulation in response to the second detecting signal DET2. According to an embodiment of the present invention, the second detecting signal DET2 is changed to a logic 'Low' (or inactivated) at a reduced pulse width, preferably at half period of the on-period Ton2 or at quarter-cycle. Thus, the width of a pulse 903 is smaller than the width Ton2 of the pulse 902, pulse 903, being the last pulse before the power is off. Preferably, the width of the pulse 903 is substantially a half-width of the pulse 902 or a quarter of a period of a normal cycle of the first or second switching signal PWMA or PWMB. The reduced pulse width is a function of the counter value stored in the buffer. For example, an one third pulse width in pulse 903 is obtained by transitioning DET2 from 'High' to 'Low' at one third the time value stored in the buffer.

Figure 10:
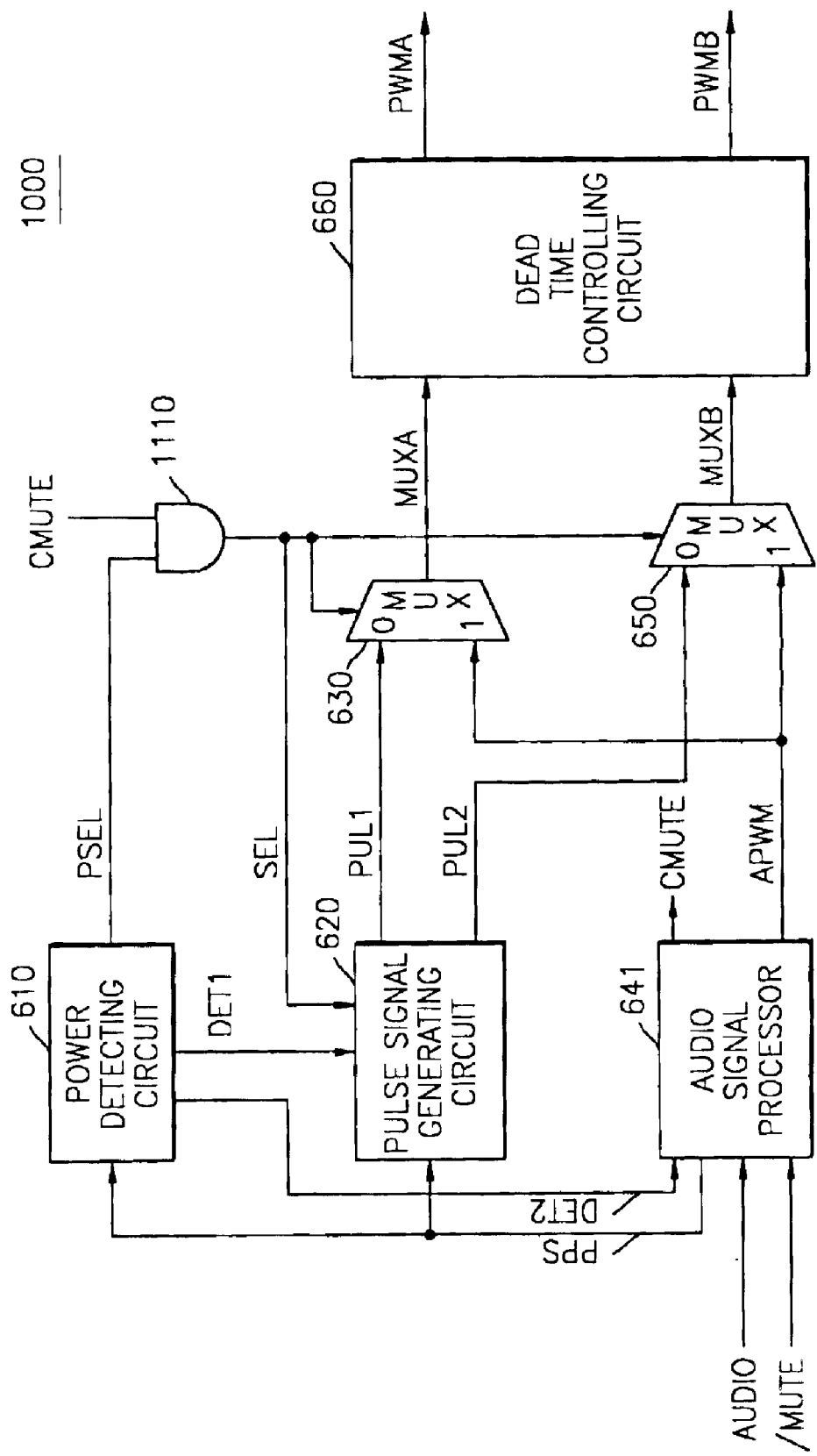
FIG. 10 shows a block diagram of a switching signal generating apparatus according to another embodiment of the present invention.

FIG. 10 is a block diagram of a switching signal generating apparatus 1000 according to another embodiment of the present invention. The switching signal generating apparatus 1000 controls an on-period of first and second switching signals PWMA, PWMB in response to a mute signal/MUTE.

Referring to FIG. 10, the switching signal generating apparatus 1000 includes a power detecting circuit 610, a pulse signal generating circuit 620, a first selection circuit 630, a audio signal processor 641, a second selection circuit 650, a dead time controlling circuit 660, and a logic gate 1010.

The power detecting circuit 610 detects a supplied power PW and generates a pre-control signal PSEL. The pre-control signal PSEL is input to one of two inputs of logic gate 1010. The output of the logic gate 1010 is control signal SEL, which functions similarly as the SEL signal in FIG. 3 to select between PUL1 and PUL2 or APWM to output from selectors 630 and 650, respectively.

The audio signal processor 641 outputs a mute control signal CMUTE to the logic gate 1010 in response to mute signal/MUTE. The audio signal processor 641 controls the time when CMUTE is active or inactive. The operations and functions of the audio signal processor 641 of the present embodiment are substantially the same as the audio signal processor 640 in FIG. 3, with the exception of the ability to disable the control signal (SEL) by the audio signal processor 641 via the CMUTE signal. According to the present embodiment, the logic gate 1010 is preferably an AND gate or an equivalent gate of the AND gate. The logic gate 1010 receives the mute control signal CMUTE and the pre-control signal PSEL, and generates a control signal SEL.

Figure 11:
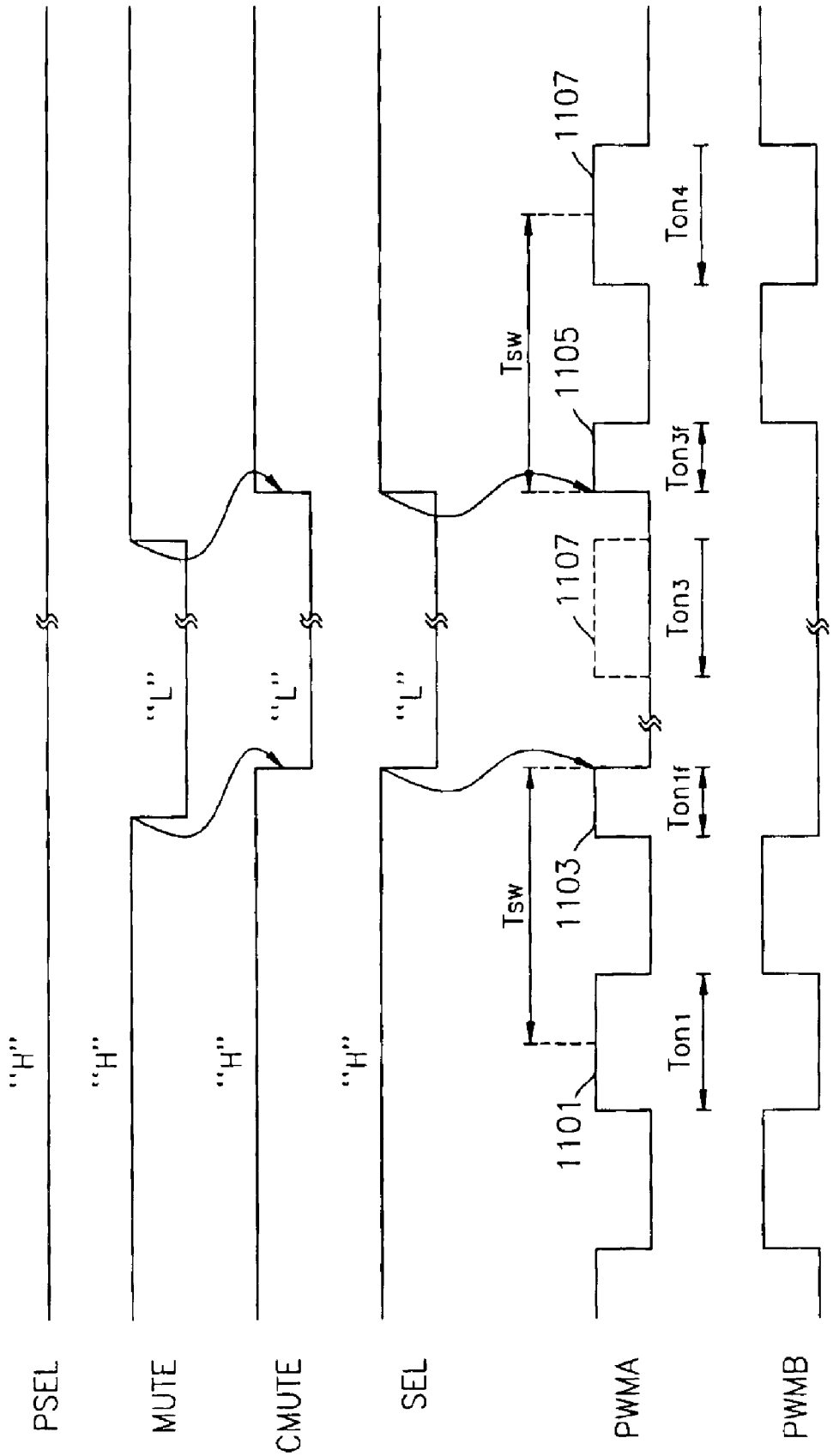
FIG. 11 shows switching waveforms at a time of mute-on and mute-off for the switching signal generating apparatus.

FIG. 11 shows switching waveforms at mute-on and mute-off for the switching signal generating apparatus 1000 in FIG. 10. Referring to FIGS. 10 and 11, when the switching signal generating apparatus 1000 is operated as a "sound pulse width modulating (PWM) mode", the PSEL signal is at logic 'High' and mute signal/MUTE is inactive at logic 'High' (or "mute-off mode"). During the mute-off mode, the switching signal generating apparatus 1000 outputs first and second switching signals PWMA, PWMB substantially the same as pulse width modulated audio signal APWM outputted from the audio signal processor 641.

When the mute signal/MUTE is transited to a logic 'Low' (or "mute-on mode"), the audio signal processor 641 in turn outputs a mute control signal CMUTE to the logic gate 1010. When the mute control signal CMUTE is transited to a logic 'Low', the control signal SEL is transited to a logic 'Low'. During a sound PWM mode, the pre-control signal is at a 'High' level, the control signal SEL is transited to the same logic level as the logic level of the mute control signal CMUTE. As in the embodiment described above for power turn-off with reference to FIG. 9, the audio signal processor 641 estimates the pulse width of an "on-period" (Ton1). The audio signal processor 641 can further generate the mute control signal CMUTE to control the "on-period" of the last pulse 1103 at a reduced pulse width prior to the mute controller.

The first selection circuit 630 and the second selection circuit 650 are switched in response to the control signal SEL. Preferably, the first selection circuit 630 and the second selection circuit 650 are switched when the pulse width Ton1f (or on-period) of the pulse 1103 is less than the pulse width Ton1 (or on-period) of the pulse 1101, preferably, Ton1f is one half of Ton1. The audio signal processor 641 outputs the pulse width modulated audio signal APWM. Thus, pop-noise generated the class-D amplifier is reduced in response to the pulse 1103.

Further, when the mute-on mode is transited to the mute-off mode, the mute signal/MUTE is transited to a logic 'High'. The audio signal processor 641 outputs the mute control signal CMUTE to the AND gate 1010 for transiting the control signal to a logic 'High' in response to the mute signal/MUTE. The audio signal processor 641 can thus generate the mute control signal CMUTE to control "on-period" of pulse 1105.

The AND gate 1010 outputs the control signal SEL having a logic 'High' in response to the mute control signal CMUTE having a logic 'High' and the pre-control signal PSEL having a logic 'High'.

The first selection circuit 630 and the second selection circuit 650 are switched in response to the control signal SEL having a logic 'High'. The first selection circuit 630 and the second selection circuit 650 is switched when pulse width Ton3f (or on-period) of the pulse 1105 is less than the pulse width Ton3 (or on-period) of the pulse 1107. According to a preferred embodiment of the present invention, the on-period of the pulse 1105 is about a half of the on-period of the pulse 1107. Thus, any pop-noise that may be generated by the pulse 1105 would be less as compared to pop-noise that may be generated by the pulse 1107.

Figure 2:
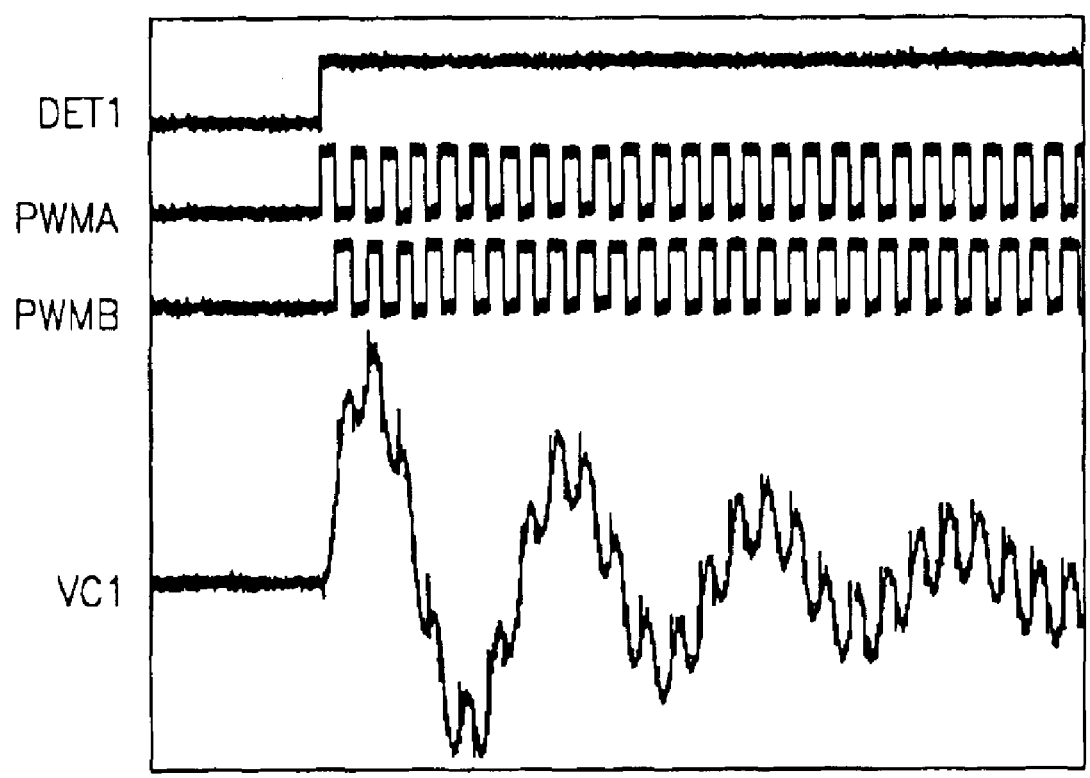
FIG. 2 shows an overshoot response of a speaker voltage when used with the amplifier of FIG. 1.
Figure 12:
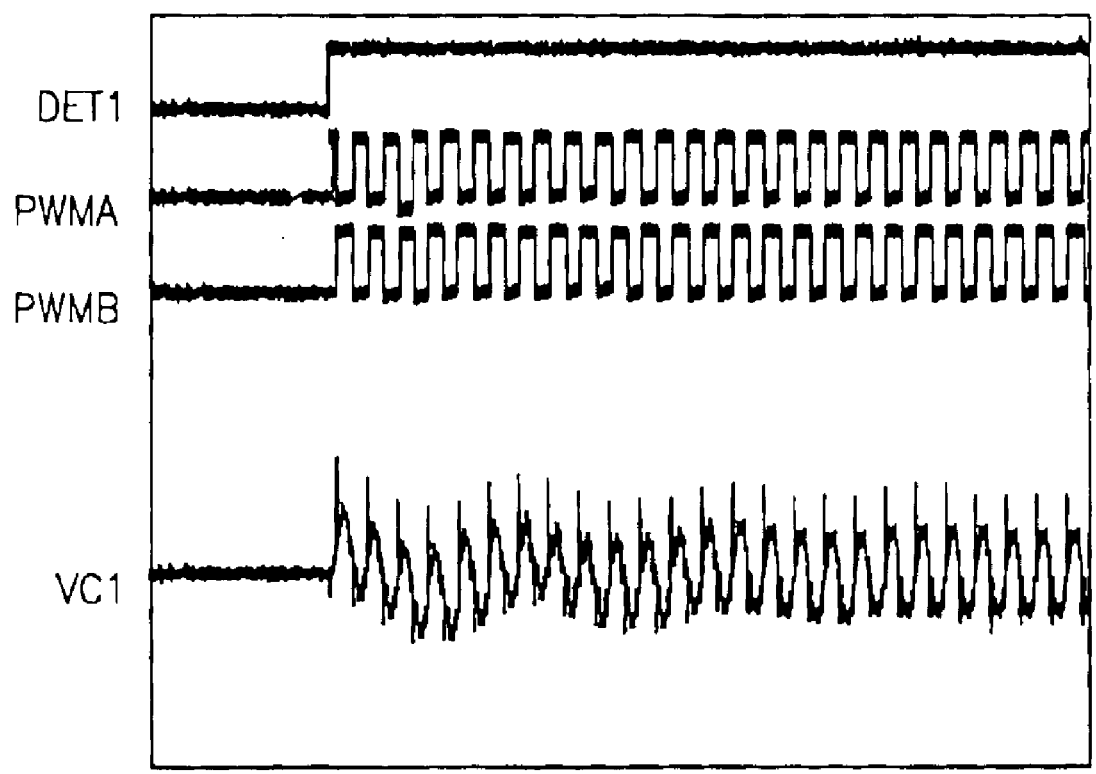
FIG. 12 is a graph showing a response of speaker voltage in an audio sound regenerating apparatus according to an embodiment of the present invention.

FIG. 12 is a graph showing a response of speaker voltage in an audio sound regenerating apparatus according to an embodiment of the present invention. Voltage Vc1 in FIG. 12 is smaller than voltage Vc1 in FIG. 2 and the overshoot response is considerably reduced compared to the conventional overshoot response in FIG. 2. Therefore, pop-noise for the sound signal generating apparatus (class-D amplifier) is reduced by using the switching signal generating apparatus 600 or 1000.

Figure 13:
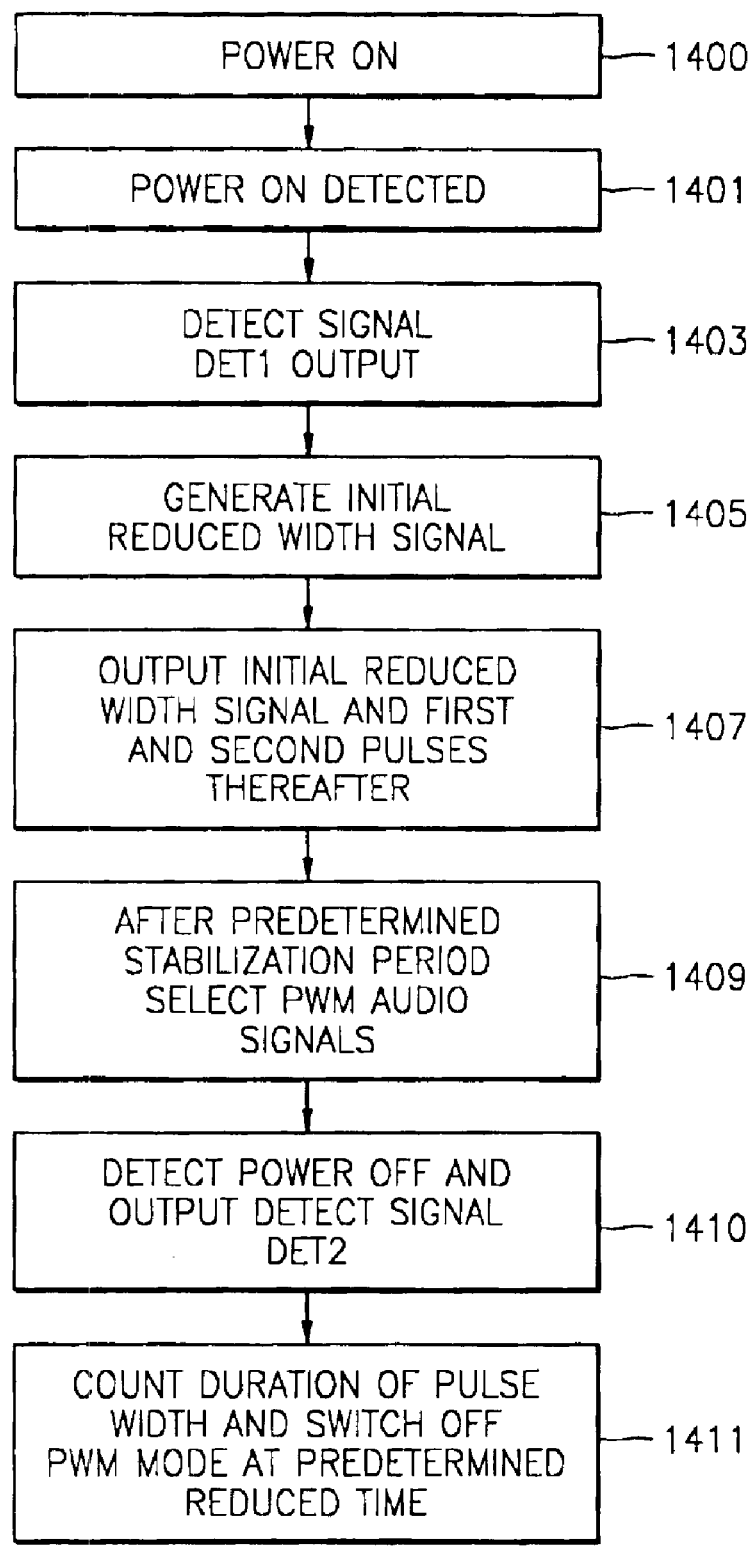
FIG. 13 is a flowchart showing a method of generating a switching signal according to an embodiment of the present invention.

FIG. 13 is a flowchart showing a method of generating a switching signal according to an embodiment of the present invention. Referring to FIGS. 3, 10, and 13, first, power is on (Step 1400). The power detecting circuit 610 detects whether the power is on (Step 1401). When the power is on, the power detecting circuit 610 outputs a first detecting signal DET1 (Step 1403). The pulse signal generating circuit 620 generates pulse signals PUL1, PUL2 (Step 1405). An initial first pulse 701 has a half width as compared to pulses 702, 703, 704.

The control signal SEL generated from the power detecting circuit 610 transits from a logic 'Low' to a logic 'High' after passing a predetermined period. The predetermined period is a period for stabilizing the pulse width modulated audio signal APWM generated from the audio signal processor 640 or 641. Regular pulse signals PUL1 and PUL2 are output after the initial reduced width signals (Step 1407).

Upon stabilization of the pulse width modulated audio signal APWM, the first selection circuit 630 and the second selection circuit 650 are selected to output PWM signals in sound PWM mode in response to the control signal SEL at logic 'High' (Step 1409).

When power PW is disconnected or being burned-off, the power detecting circuit 610 detects power-off and outputs the second detecting signal DET2 to the audio signal processor 640 (Step 1410). As shown in FIG. 9, the second detecting signal DET2 transits to inactive level when the last pulse width 903 is about half width of the pulse width 902. Then, the sound PWM mode is stopped when power is completely off (Step 1411).

The audio signal processor 640 detects a state of the mute signal/MUTE and determines whether the mute signal/MUTE is in a state of mute-on. If the mute signal/MUTE is not in a state of mute-on, the switching signal generating apparatus 1000 performs a sound PWM mode. While the switching signal generating apparatus 1000 is in a state of mute-on, the audio signal processor 641 outputs a mute controlling signal CMUTE to the AND gate 1010. The first selection circuit 630 and the second selection circuit 650 are switched in response to the control signal SEL.

Although the present invention has been described herein with reference to the accompanying drawings, it is to be understood that the present invention is not limited to those precise embodiments, and various other changes and modifications may be affected therein by one skilled in the art without departing from the scope and spirit of the invention. All such changes and modifications are intended to be included within the scope of the invention as defined by the appended claims.

What is claimed is:

1. A circuit for handling pulse width modulation (PWM) first signal and PWM second signal for outputting to an amplifier, the PWM first signal having one of a same phase and an opposite phase relationship with the PWM second signal, the circuit comprising:

a power detector for detecting power turn on to the amplifier and outputting a power on signal; and a pulse generator having: a duty cycle generator for generating a first pulse signal corresponding to the PWM first signal and a second pulse signal corresponding to the PWM second signal; and a pulse reducing generator for generating a reduced-width first pulse or a reduced-width second pulse for outputting to the amplifier upon receipt of the power on signal.

2. The circuit of claim 1, wherein the pulse generator further includes a controller for outputting the reduced-width first pulse or the reduced-width second pulse upon receipt of the power on signal and for outputting the first pulse signal and the second pulse signal to the amplifier thereafter.

3. The circuit of claim 1, further including a select circuit for generating a select signal for selecting between the PWM first and second signals during one selection mode and the signals from the pulse generator during another selection mode.

4. The circuit of claim 3, further including a counter for counting time upon receipt of the power on signal and to output the select signal in the another selection mode upon reaching a predetermined count for outputting the PWM first and second signals to the amplifier.

5. The circuit of claim 1, wherein the reduced-width first pulse is about one-half the pulse width of the first pulse signal.

6. The circuit of claim 1, further including a delay for delaying by a predetermined time the first pulse signal to output a delayed first pulse signal that transitions with a delay by the predetermined time to provide a time gap between the transition of the delayed first pulse signal and the transition of the second pulse signal.

7. The circuit of claim 1, wherein the amplifier includes a serially connected pair of transistors for receiving at their gates the first pulse signal and the second pulse signal.

8. A circuit for handling pulse width modulation (PWM) first signal and PWM second signal for outputting to an amplifier, the PWM first signal having one of a same and an opposite phase relationship with the PWM second signal, the circuit comprising:

a power detector for detecting power turn off to the amplifier and outputting a power off signal; and a counter for counting the duration of the pulse width of the PWM first signal, the counter being activated upon detection of the power off signal, and for outputting a select signal upon reaching a predetermined reduced-width time count to cause an output of a reduced pulse width PWM first signal or reduced pulse width PWM second signal prior to complete power turn off from the amplifier.

9. The circuit of claim 8, further including a synchronizing circuit for synchronizing the power off signal using a system clock.

10. The circuit of claim 8, wherein the amplifier includes a pair of transistors for receiving at their gates the PWM first signal and the PWM second signal.

11. The circuit of claim 8, further including a mute circuit for outputting the select signal to cause an output of a reduced pulse width PWM first signal or reduced pulse width PWM second signal upon receipt of a mute signal.

12. The circuit of claim 11, wherein the mute circuit is an AND gate.

13. The circuit of claim 12, wherein the reduced pulse width PWM first signal or reduced pulse width PWM second signal is the last pulse signal received by the amplifier prior to complete power turn off.

14. The circuit of claim 10, wherein the reduced-width is about one half of the width of the PWM first signal or the PWM second signal.

15. A circuit for handling pulse width modulation (PWM) first signal and PWM second signal for outputting to an amplifier, the PWM first signal having one of a same phase and an opposite phase relationship with the PWM second signal, the circuit comprising:

a power detector for detecting power turn on to the amplifier and outputting a power on signal and detecting a power turn off to the amplifier and outputting a power off signal;

a pulse generator having: a duty cycle generator for generating a first pulse signal corresponding to the PWM first signal and a second pulse signal corresponding to the PWM second signal, and a reduced-width generator for generating at least one of a reduced-width first pulse and a reduced-width second pulse;

a controller for selecting one of the reduced-width first pulse and the reduced-width second pulse for outputting to the amplifier upon receipt of the power on signal and for selecting the first pulse signal and the second pulse signal for outputting to the amplifier thereafter; and a counter for counting the duration of the pulse width of the PWM first signal, the counter being activated upon detection of the power off signal and a select circuit for outputting an off select signal upon reaching a predetermined reduced-width time count to cause an output of one of a reduced-width PWM first signal and a reduced-width PWM second signal.

16. The circuit of claim 15, wherein the select circuit further includes a counter for counting time upon receipt of the power on signal and to output an on select signal for first outputting one of the reduced-width first pulse and the reduced-width second pulse and then the first pulse signal and the second pulse signal to the amplifier.

17. The circuit of claim 15, further including a mute circuit for outputting the on select signal for outputting one of the reduced-width first pulse and the reduced-width second pulse to the amplifier upon receipt of a mute signal.

18. The circuit according to claim 17, wherein the mute circuit is synchronized using a system clock and upon mute inactivation, to cause an output of one of the reduced-width PWM first signal and the reduced-width PWM second signal.

19. The circuit according to claim 15, wherein the reduced-width first pulse signal has a pulse width about one half of the pulse width of the first pulse signal.

20. The circuit according to claim 15, wherein the predetermined reduced-width time count is about one half the duration of the pulse width of the PWM first signal.

21. The circuit of claim 15, further including a delay for delaying by a predetermined time the first pulse signal to output a delayed first pulse signal that transitions with a delay by the predetermined time to provide a time gap between the transition of the delayed first pulse signal and the transition of the second pulse signal.

22. The circuit of claim 21, wherein the amplifier includes a pair of transistors for receiving at their gates the delayed first pulse signal and the second pulse signal.

23. The circuit of claim 15, wherein the amplifier includes a pair of transistors for receiving at their gates the first pulse signal and the second pulse signal.

24. A method for handling pulse width modulation (PWM) first signal and PWM second signal for outputting to an amplifier, the PWM first signal having one of a same phase and an opposite phase relationship with the PWM second signal, the method comprising:

detecting power turn on to the amplifier and outputting a power on signal; and generating a first pulse signal corresponding to the PWM first signal and a second pulse signal corresponding to the PWM second signal; and generating a reduced-width first pulse or a reduced-width second pulse for outputting to the amplifier upon receipt of the power on signal.

25. The method of claim 24, further including outputting the reduced-width first pulse or the reduced-width second pulse to the amplifier upon receipt of the power on signal and outputting the first pulse signal and the second pulse signal to the amplifier thereafter.

26. The method of claim 24, further including generating a select signal for selecting between the PWM first and second signals during one selection mode and the first pulse signal and the second pulse signal during another selection mode for outputting to the amplifier.

27. The method of claim 24, wherein the reduced-width first pulse is about one-half the pulse width of the first pulse signal.

28. The method of claim 24, further including delaying by a predetermined time the first pulse signal to output a delayed first pulse signal that transitions with a delay by the predetermined time to provide a time gap between the transition of the delayed first pulse signal and the transition of the second pulse signal.

29. The method of claim 24, further including the steps of:

detecting power turn off to the amplifier and outputting a power off signal;

counting the duration of the pulse width of the PWM first signal upon detection of the power off signal; and outputting a select signal upon reaching a predetermined reduced-width time count to cause an output of a reduced pulse width PWM first signal or reduced pulse width PWM second signal prior to complete power turn off from the amplifier.

30. The method of claim 24, wherein the reduced pulse width PWM first signal or reduced pulse width PWM second signal is the last pulse signal received by the amplifier prior to complete power turn off.

31. The method of claim 24, wherein the reduced-width is about one half of the width of the PWM first signal or the PWM second signal.

32. The method of claim 24, further including outputting the select signal to cause an output of a reduced pulse width PWM first signal or reduced pulse width PWM second signal upon receipt of a mute signal.

33. A circuit for handling pulse width modulation (PWM) first signal and PWM second signal for outputting to an amplifier, the PWM first signal having one of a same phase and an opposite phase relationship with the PWM second signal, the circuit comprising:

means for detecting power turn on to the amplifier and outputting a power on signal and detecting a power turn off to the amplifier and outputting a power off signal;

means for generating a first pulse signal corresponding to the PWM first signal and a second pulse signal corresponding to the PWM second signal, and a reduced-width generator for generating at least one of a reduced-width first pulse and a reduced-width second pulse;

means for selecting one of the reduced-width first pulse and the reduced-width second pulse for outputting to the amplifier upon receipt of the power on signal and for selecting the first pulse signal and the second pulse signal for outputting to the amplifier thereafter; and a counter for counting the duration of the pulse width of the PWM first signal, the counter being activated upon detection of the power off signal and a select circuit for outputting an off select signal upon reaching a predetermined reduced-width time count to cause an output of one of a reduced-width PWM first signal and a reduced-width PWM second signal.

* * * * *